US006955972B2

(12) United States Patent
Lee et al.

(10) Patent No.: US 6,955,972 B2
(45) Date of Patent: Oct. 18, 2005

(54) METHODS OF FABRICATING INTEGRATED CIRCUIT DEVICES HAVING TRENCH ISOLATION STRUCTURES

(75) Inventors: Jae-Kyu Lee, Kyunggi-do (KR); Sang-Hyeon Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/457,910

(22) Filed: Jun. 10, 2003

(65) Prior Publication Data

US 2003/0211703 A1 Nov. 13, 2003

Related U.S. Application Data

(62) Division of application No. 09/995,351, filed on Nov. 27, 2001, now Pat. No. 6,607,959.

(30) Foreign Application Priority Data

Nov. 30, 2000 (KR) ............................. 2000-72091

(51) Int. Cl.[7] ............................................. H01L 21/76
(52) U.S. Cl. ..................................... 438/430; 438/675
(58) Field of Search ......................... 438/296, 631–635, 438/637, 640, 675, 424–430, 453

(56) References Cited

U.S. PATENT DOCUMENTS

| 5,466,628 A | 11/1995 | Lee et al. ................. 438/386 |
| 5,877,067 A | 3/1999 | Kimura et al. ............. 438/430 |
| 5,885,883 A * | 3/1999 | Park et al. ................. 438/435 |
| 5,937,297 A | 8/1999 | Peidous ..................... 438/270 |
| 5,940,716 A | 8/1999 | Jin et al. ................... 438/424 |
| 5,970,356 A | 10/1999 | Jeon .......................... 438/361 |
| 6,001,696 A | 12/1999 | Kim et al. ................. 438/296 |
| 6,037,237 A | 3/2000 | Park et al. ................. 438/424 |
| 6,071,792 A | 6/2000 | Kim et al. ................. 438/424 |
| 6,133,116 A | 10/2000 | Kim et al. ................. 438/430 |
| 6,169,002 B1 | 1/2001 | Hong ......................... 438/296 |
| 6,187,651 B1 * | 2/2001 | Oh ............................. 438/435 |
| 6,218,273 B1 | 4/2001 | Kang ......................... 438/590 |
| 6,218,725 B1 | 4/2001 | Jeon .......................... 257/574 |
| 6,251,746 B1 | 6/2001 | Hong et al. ................ 438/424 |
| 6,277,709 B1 * | 8/2001 | Wang et al. ............... 438/430 |
| 6,452,246 B1 * | 9/2002 | Komori ...................... 257/506 |
| 6,486,039 B2 * | 11/2002 | Yoo et al. .................. 438/425 |

* cited by examiner

Primary Examiner—David Nelms
Assistant Examiner—Calvin Lee
(74) Attorney, Agent, or Firm—Myers Bigel Sibley & Sajovec

(57) ABSTRACT

Methods of fabricating integrated circuit devices include forming a trench in a face of an integrated circuit substrate. The trench has a trench sidewall and a trench floor. The method further including forming a first insulating layer on the trench sidewall that exposes at least part of the trench floor and forming a conductive plug in the trench on the trench floor. The conductive plug is electrically connected to the substrate at the trench floor through the trench sidewall that exposes the at least part of the trench floor. The conductive plug also has a plug top opposite the trench floor that is recessed beneath the face of the substrate. The method further includes forming a second insulating layer on the plug top.

9 Claims, 13 Drawing Sheets

METHODS OF FABRICATING INTEGRATED CIRCUIT DEVICES HAVING TRENCH ISOLATION STRUCTURES

RELATED APPLICATIONS

This application claims priority from and is a divisional of U.S. patent application Ser. No. 09/995,351, now U.S. Pat. No. 6,607,959, filed on Nov. 27, 2001, which claims priority from Korean Application No. 2000-72091, filed Nov. 30, 2000, the disclosures of which are hereby incorporated herein by reference as if set forth in their entirety.

FIELD OF THE INVENTION

The present invention relates to integrated circuit devices and fabrication methods, and more particularly, to integrated circuit devices having trench isolation structures that include a conductive plug that is electrically connected to the substrate and related fabrication methods.

BACKGROUND OF THE INVENTION

Improved active device isolation techniques may be desirable in order to facilitate ongoing attempts to increase integration density in integrated circuit devices by designing devices having reduced unit cell size. Conventional device isolation techniques include local oxidation of silicon (LOCOS) and shallow trench isolation (STI) techniques, for example. Such device isolation techniques are disclosed in U.S. Pat. Nos. 6,187,651, 6,218,273, 6,251,746, 5,885,883, 5,940,716, 6,001,696 and 6,037,237.

Such techniques may, however, exhibit problems that may affect the reliability of the integrated circuit. For example, the LOCOS technique, when applied to highly integrated devices, may exhibit oxide thinning and punch through parasitics. Moreover, LOCOS techniques tend to produce devices having narrow width effect. In other words, as width of the channel of an integrated circuit is reduced, the threshold voltage of the channel may increase.

By way of further example, STI techniques that include the formation of trench isolation regions, also may exhibit problems that may affect the reliability of the integrated circuit. First, a parasitic "hump" phenomenon may occur. The hump phenomenon means that the turn-on characteristics of a transistor formed in the active region may be deteriorated because of the presence of a parasitic transistor (adjacent the sidewall portions of the active region) having a relatively low threshold voltage. Second, an inverse narrow-width effect is generated. The inverse narrow-width effect is also a parasitic phenomenon, which can, for example, lower the effective threshold voltage as the width of a gate electrode becomes narrower by a strong electric field generated at the sharp edge of the active region. Third, a gate oxide-thinning phenomenon may be generated whereby the gate oxide film formed at the sharp edge portion of the active region is thinner than the gate oxide film formed in another portion removed from the edge portion. This thinner gate oxide film may increase the likelihood of dielectric breakdown, which can deteriorate the characteristics of devices formed in the active region.

Now referring to FIG. 1, a pair of arrows denote an influence of an electric field upon an active region 13 of a specific cell in a conventional Dynamic Random Access Memory (DRAM) device having gate lines 11. FIG. 2 illustrates the effect of cell spacing ($L_{SP}$) on the influence of an electric field in a conventional device. As illustrated, the narrower the cell-to-cell spacing, the greater the influence of the electric field. For example, when a voltage $V_{NS}$ applied to a storage node of an adjacent cell is changed from 0V to 2V, a gate voltage $V_G$ is 0.5V, and the spacing $L_{SP}$ is 0.1 $\mu$m, the potential scarcely changes at each position of a conventional channel. On the other hand, if the spacing $L_{SP}$ is 0.06 $\mu$m, the potential difference may be 0.1V or higher.

To address the issue with respect to the influence of the electric field, insulating layers, for example insulating layer 20 illustrated in FIG. 3, may be filled with a conductive material such as polysilicon 31 to shield the electric field. This technique is discussed in detail in U.S. Pat. No. 6,133,116 to Kim et al. entitled Methods of Forming Trench Isolation Regions Having Conductive Shields Therein, the disclosure of which is hereby incorporated herein by reference in its entirety. Although this approach may improve the existing techniques, it may not completely prevent other causes from lowering the threshold voltage of the device.

Recently, another approach has been suggested, in which impurities may be implanted into a device isolation layer. However, if the implanted impurities are enough to prevent the inverse narrow width effect, a junction profile of a cell may become stiff thus reducing the junction width of the cell, which is also undesirable because an electric field may get concentrated at the junction which may increase a junction leakage current.

SUMMARY OF THE INVENTION

Integrated circuit devices according to embodiments of the present invention include an integrated circuit substrate having a face and a trench in the face. The trench has a trench sidewall and a trench floor. A first insulating layer is provided on the trench sidewall that exposes at least part of the trench floor and a conductive plug is provided in the trench on the trench floor. The conductive plug is electrically connected to the substrate at the trench floor through the trench sidewall that exposes the at least part of the trench floor. The conductive plug also has a plug top opposite the trench floor that is recessed beneath the face of the substrate. A second insulating layer is provided on the plug top.

In some embodiments of the present invention the second insulating layer may be on the plug top and extend onto the trench sidewall between the plug top and the face of the substrate. Alternatively, the second insulating layer may be a conformal insulating layer on the plug top that is recessed beneath the face and also extends onto the trench sidewall between the plug top and the face. The first insulating layer may include a first layer of oxide and a second layer of silicon nitride. Alternatively, the first insulating layer may include a layer of SiON. The layer of SiON may have a thickness of from about 10 Å to about 100 Å.

In further embodiments of the present invention, the conductive plug may include polysilicon. The conductive plug may have a thickness of about 3000 Å. The second insulating layer may include a silicon nitride layer. The silicon nitride layer may have a thickness from about 10 Å to about 500 Å.

Still further embodiments of the present invention include methods of fabricating integrated circuit devices that include forming a trench in a face of an integrated circuit substrate. The trench has a trench sidewall and a trench floor. The method further including forming a first insulating layer on the trench sidewall that exposes at least part of the trench floor and forming a conductive plug in the trench on the trench floor. The conductive plug is electrically connected to the substrate at the trench floor through the trench sidewall that exposes the at least part of the trench floor. The conductive plug also has a plug top opposite the trench floor that is recessed beneath the face of the substrate. The method further includes forming a second insulating layer on the plug top.

DETAILED DESCRIPTION OF THE INVENTION

Figure 1:
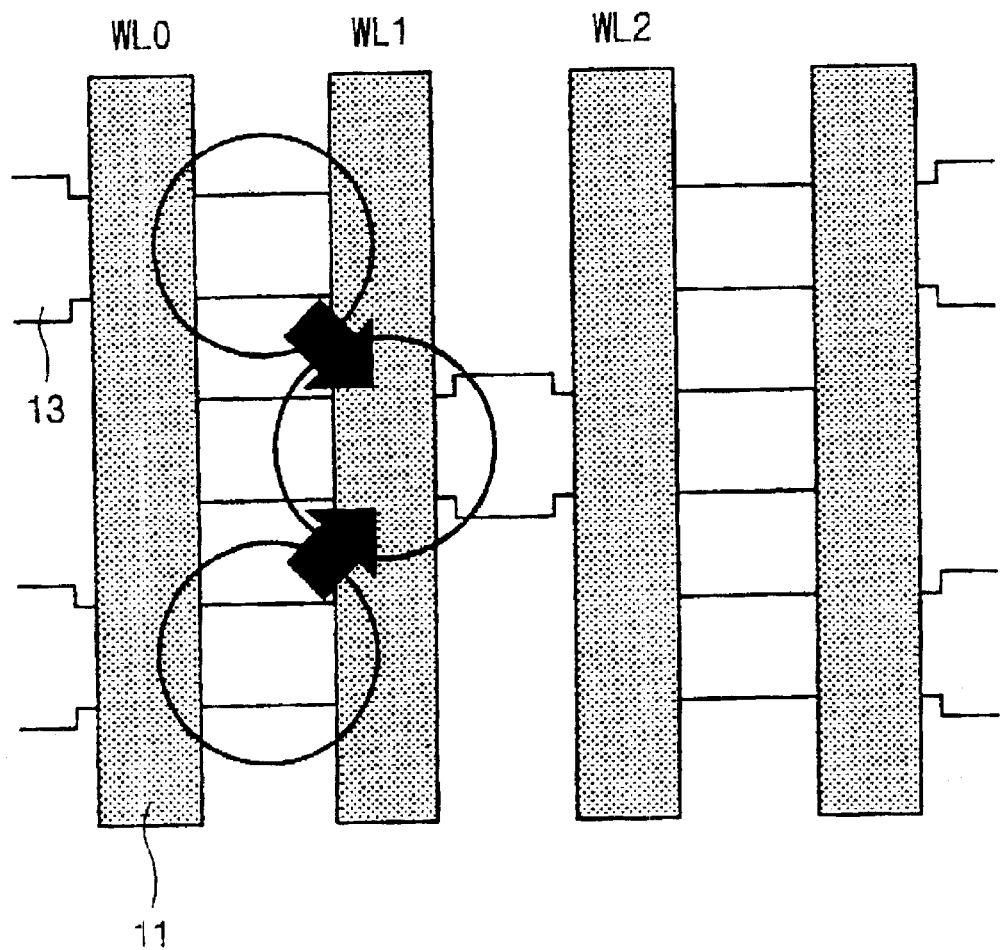
FIG. 1 is a conceptual view illustrating an influence of an electric field on a specific cell of a conventional dynamic random access memory (DRAM) device.
Figure 2:
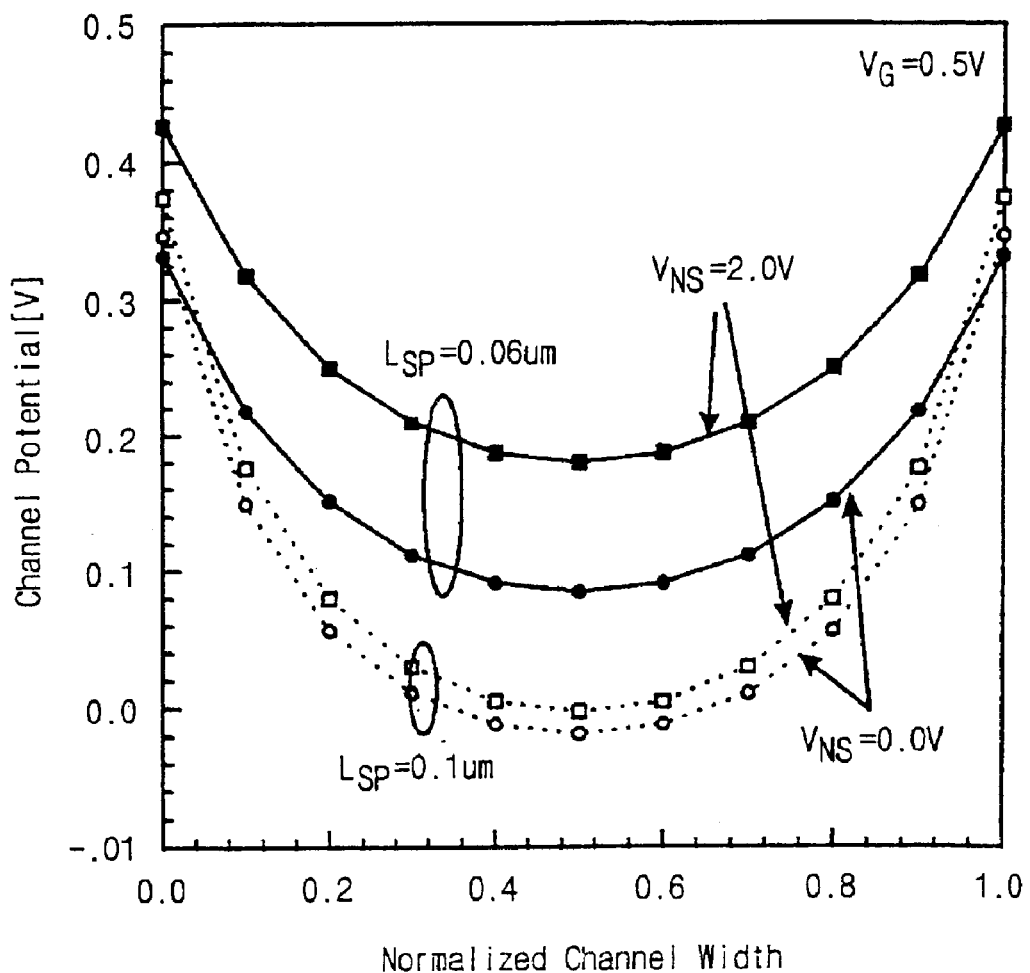
FIG. 2 is a graph that illustrates the influence of the cell-to-cell spacing on the electric field in a conventional device.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. Like reference numerals refer to like elements throughout.

Embodiments of the present invention will now be described in detail below with reference to FIGS. 4 through 15, which illustrate various embodiments of the present invention, and various processes of fabricating embodiments of the present invention. In embodiments of the present invention, an integrated circuit device is provided that includes a conductive plug in a trench isolation structure that is electrically connected to the substrate through a trench floor that is at least partially devoid of an insulating layer. In other embodiments of the present invention, the trench floor may be completely or substantially devoid of an insulating layer. Thus, if a substrate is lightly doped with P-type impurities, the conductive plug and the substrate may form an ohmic contact. Therefore, a voltage applied to the substrate may be directly applied to the conductive plug in the trench making it is possible to achieve tight device isolation between the active regions having a source/drain region that is doped with n-type impurities. Thus, the present invention may reduce the occurrence of the inverse narrow width effect.

Figure 4:
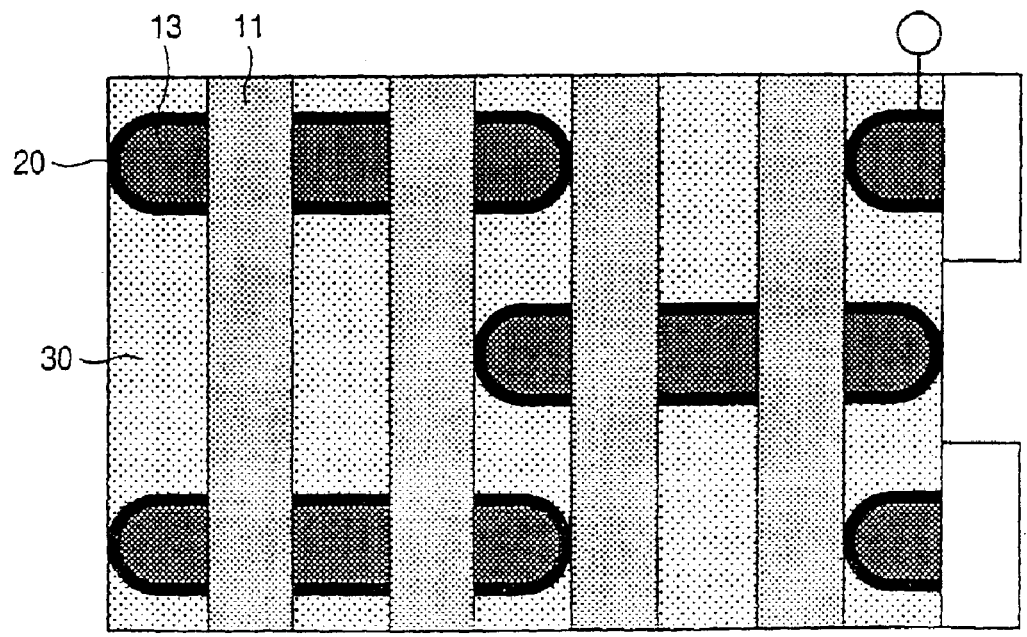
FIG. 4 is a top plan view illustrating a gate line formed on an active region in a cell area of a DRAM device according to embodiments of the present invention.
Figure 5:
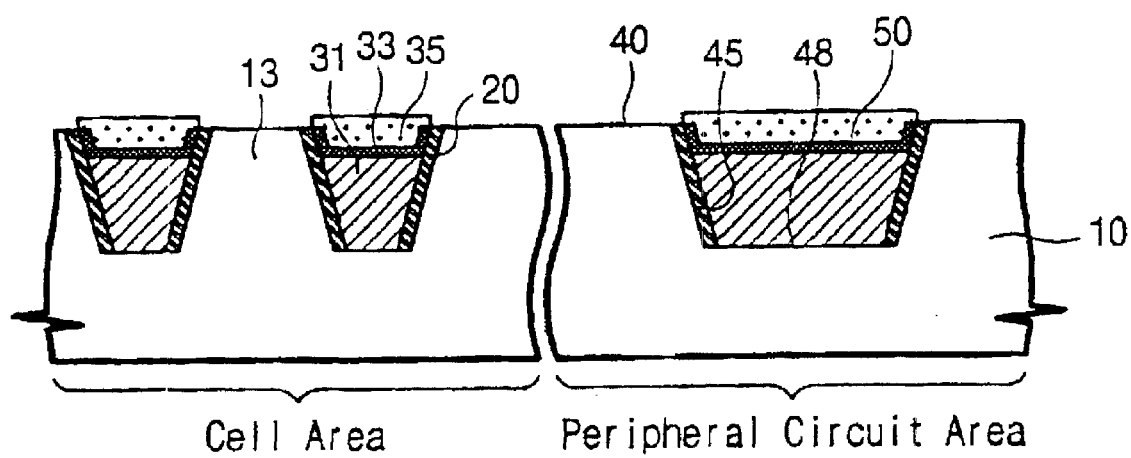
FIG. 5 is a cross-sectional view of an integrated circuit according to embodiments of the present invention.

Referring to FIG. 4, a gate line is formed on an active region 13 in a cell area of a dynamic random access memory (DRAM) in accordance with the present invention. As illustrated in FIG. 5, integrated circuit devices according to embodiments of the present invention will be described in further detail. As seen in both the cross section of the cell area and the peripheral circuit area of FIG. 5, a substrate 10 is provided having a face 40. A trench is provided in the face 40 of the substrate 10, which has a trench sidewall 45 and a trench floor 48. Although embodiments of the present invention are described herein as having a single trench sidewall, such as in a circular or elliptical shaped trench, the present invention should not be limited to this configuration. For example, embodiments of the present invention may have two or more sidewalls, such as in a polygonal trench.

A first insulating layer 20 is provided on the trench sidewall 45 that exposes at least part of the trench floor 48. The first insulating layer 20 may be a single layer of, for example, SiON. If the first insulating layer 20 includes a layer of SiON it may have a thickness of from about 10 Å to about 100 Å. Alternatively, the insulating layer 20 may include multiple layers of, for example, silicon oxide and silicon nitride. It will be understood that the first insulating layer 20 may include other materials that may perform the functions of the first insulating layer and should not be limited to the materials described above.

A conductive plug 31 is provided in the trench on the trench floor 48. The conductive plug 31 has a plug top 50 opposite the trench floor 48 that is electrically connected to the substrate 10 at the trench floor 48. The plug top 50 is recessed beneath the face 40 of the substrate 10 as illustrated in FIG. 5. The conductive plug 31 may include, for example, polysilicon or metals having high work-function. If the conductive plug 31 includes polysilicon, the polysilicon may be heavily doped with p-type impurities. The conductive plug 31 may have a thickness of about 3000 Å.

A second insulating layer is provided on the top of the conductive plug. The second insulating layer may include, for example, a silicon nitride layer 33. The silicon nitride layer 33 may have a thickness from about 10 Å to about 500 Å. The second insulating layer may further include a layer of silicon oxide 35. As illustrated in FIG. 5, the second insulating layer is on the plug top 50 and may extend onto the trench sidewall 45 between the plug top 50 and the face 40 of the substrate 10. Alternatively, the second insulating layer may include a conformal insulating layer on the plug top 50 that is recessed beneath the face 40 of the substrate 10 and also extends onto the trench sidewall 45 between the plug top 50 and the face 40 of the substrate 10. A chemical vapor deposition (CVD) silicon oxide layer may optionally be provided on the surface of the integrated circuit device (not shown).

Figure 3:
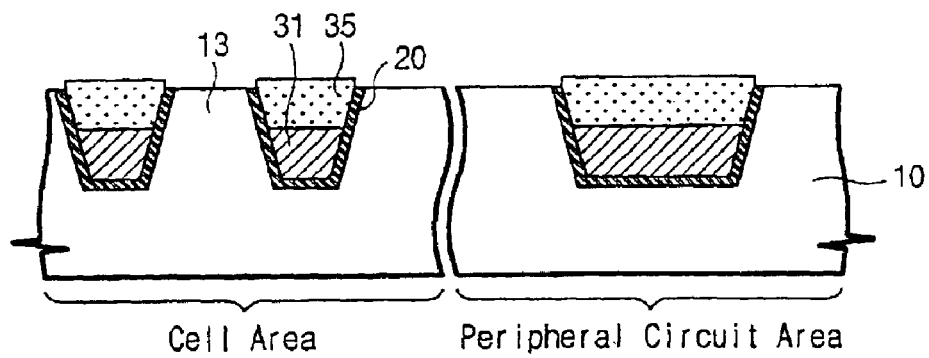
FIG. 3 is a cross-sectional view of a conventional integrated circuit device having a conductive material on the floor of the trench.

Integrated circuit devices according to embodiments of the present invention may provide an advantage over conventional integrated circuit devices, for example, the integrated circuit of FIG. 3. In particular, some embodiments of the present invention provide a conductive plug in a trench isolation structure that is electrically connected to the substrate through a trench floor that is at least partially devoid of an insulating layer. Alternatively, the trench floor may be completely or substantially devoid of an insulating layer. Thus, if a substrate is lightly doped with P-type impurities, the conductive plug and the substrate may form an ohmic contact. Therefore, a voltage applied to the substrate may be directly applied to the conductive plug in the trench. As a result, the conductive plug may have the same potential as the sidewall of the trench. Accordingly, it is possible to decrease the possibility of an inversion channel being formed at the upper sidewall of the trench, even though a subthreshold voltage may be applied to the gate. This may improve the inverse narrow width effect. In addition, the p-type impurities in the conductive plug may be diffused into the floor of the trench in a subsequent thermal process, thereby increasing the doping concentration of the substrate under the trench. Thus, it may be possible to achieve tight device isolation between the active regions 13 having a source/drain region (not shown) that is doped with n-type impurities.

Figure 6A:
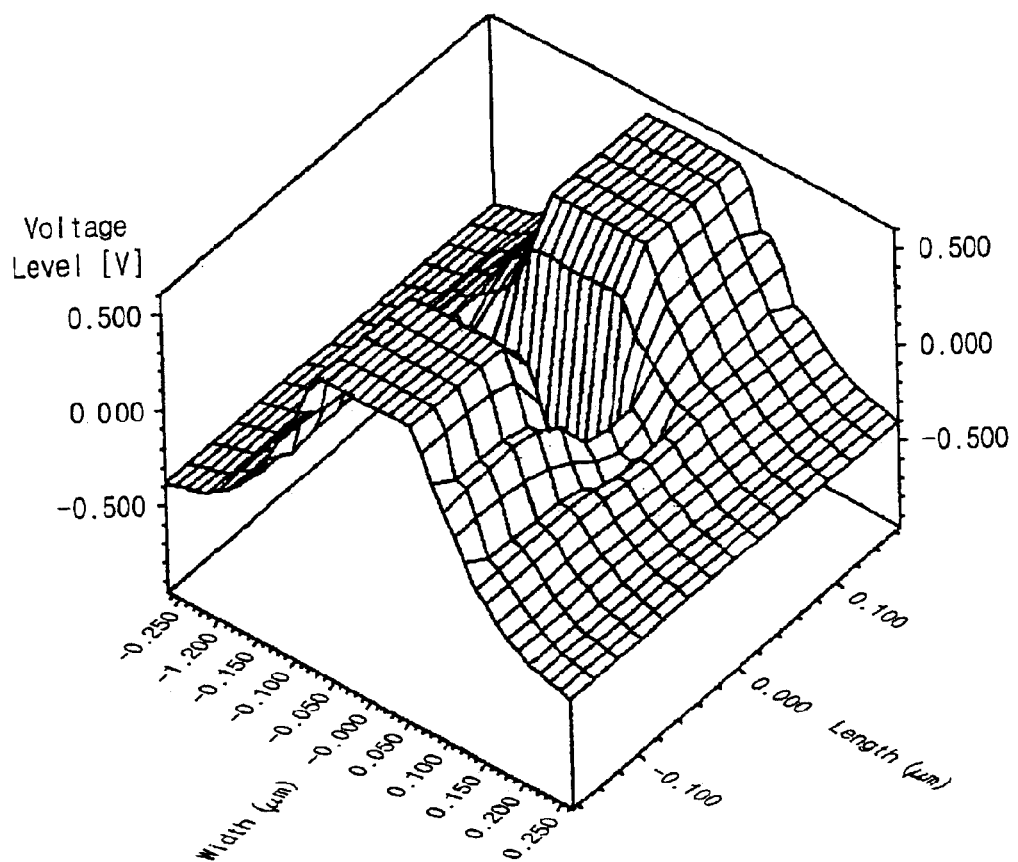
FIGS. 6A and 7A are 3-dimensional graphs that illustrate a potential distribution and a hole distribution at a transistor of a conventional integrated circuit device.
Figure 6B:
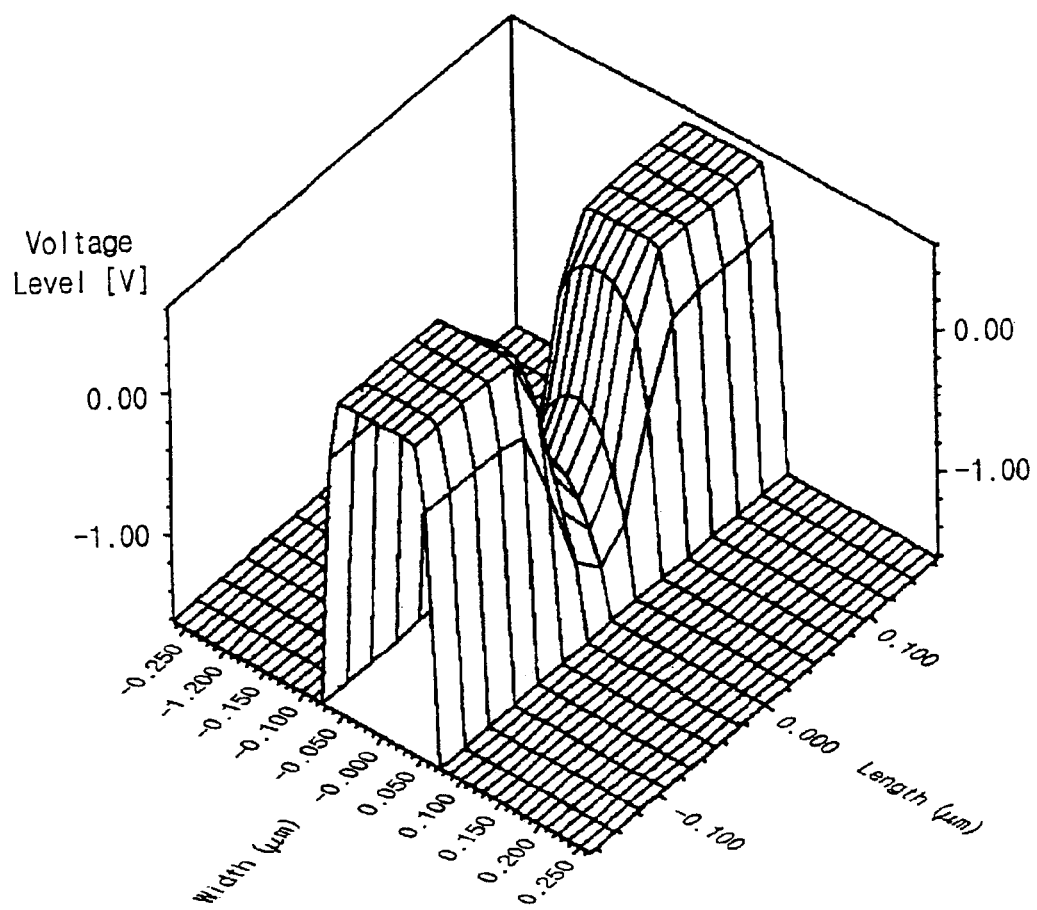
FIGS. 6B and 7B are 3-dimensional graphs showing a potential distribution and a hole distribution, respectively, at a transistor of an integrated circuit device according to embodiments of the present invention.
Figure 7A:
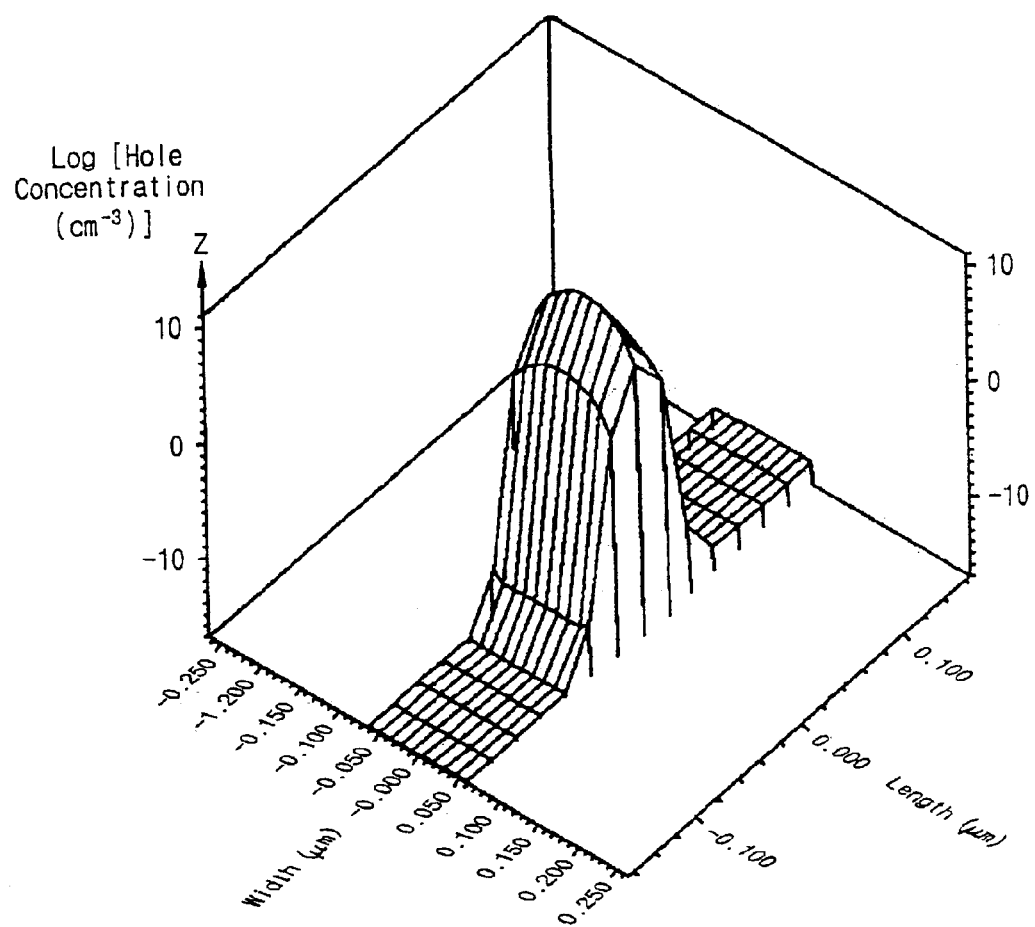
Figure 7B:
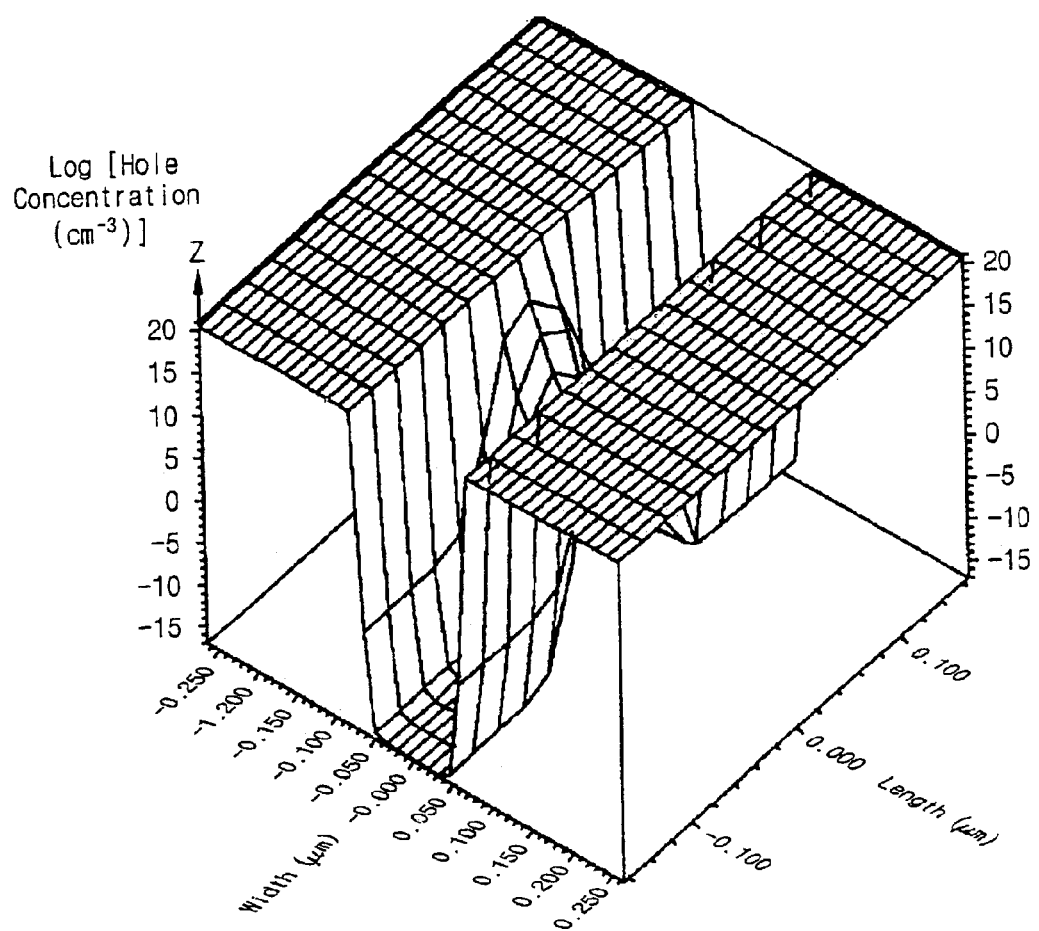

Now referring to FIGS. 6A and 7A, aspects of conventional integrated circuits will be described. As illustrated in FIG. 6A, a voltage of a conventional integrated circuit is typically higher in both ends of a channel than in a middle of the channel. Furthermore, as illustrated in FIG. 7A, a hole concentration of a conventional device is higher in the middle than in the sides of the channel. In contrast, as illustrated in FIGS. 6B and 7B, a voltage of an integrated circuit according to embodiments of the present invention is higher in both ends of the channel than in the middle of the channel and a hole density of a device according to embodiments of the present invention is higher in both sides of the channel than in the middle of the channel.

In a memory device, current flows through a channel when one voltage is applied to a transistor drain through a bitline and another voltage is applied to a gate electrode. In a conventional transistor as shown in FIGS. 6A and 7A, current starts to flow at both ends of the channel before a voltage is sufficiently applied to a gate electrode. In contrast, according to embodiments of the present invention as shown in FIGS. 6B and 7B, a negative voltage may be applied to the inside of the trench. Thus, current may not flow at both ends of the channel before an operational voltage is sufficiently applied to the gate electrode. As a result, the inverse narrow width effect may be reduced. According to embodiments of the present invention, the insulating layer formed on the sidewall of the trench serves as a gate insulating layer of the lateral gate. Thus, an electric field which is transferred from an adjacent element through a device isolation layer in the prior art trench may be shielded from the device isolation layer in the present invention.

Figure 8:
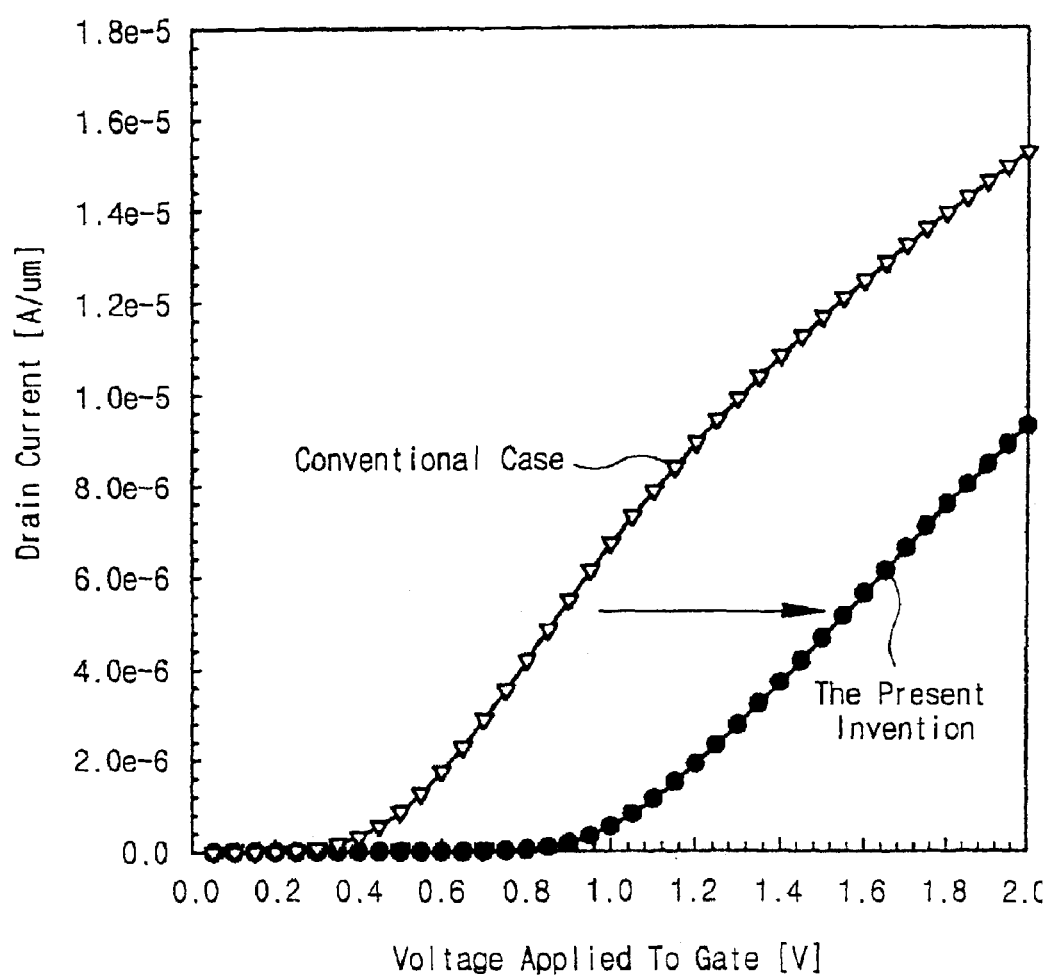
FIG. 8 is graph illustrating an increasing aspect of a drain current based upon an applied gate voltage at a transistor of an integrated circuit device according to embodiments of the present invention.
Figure 9:
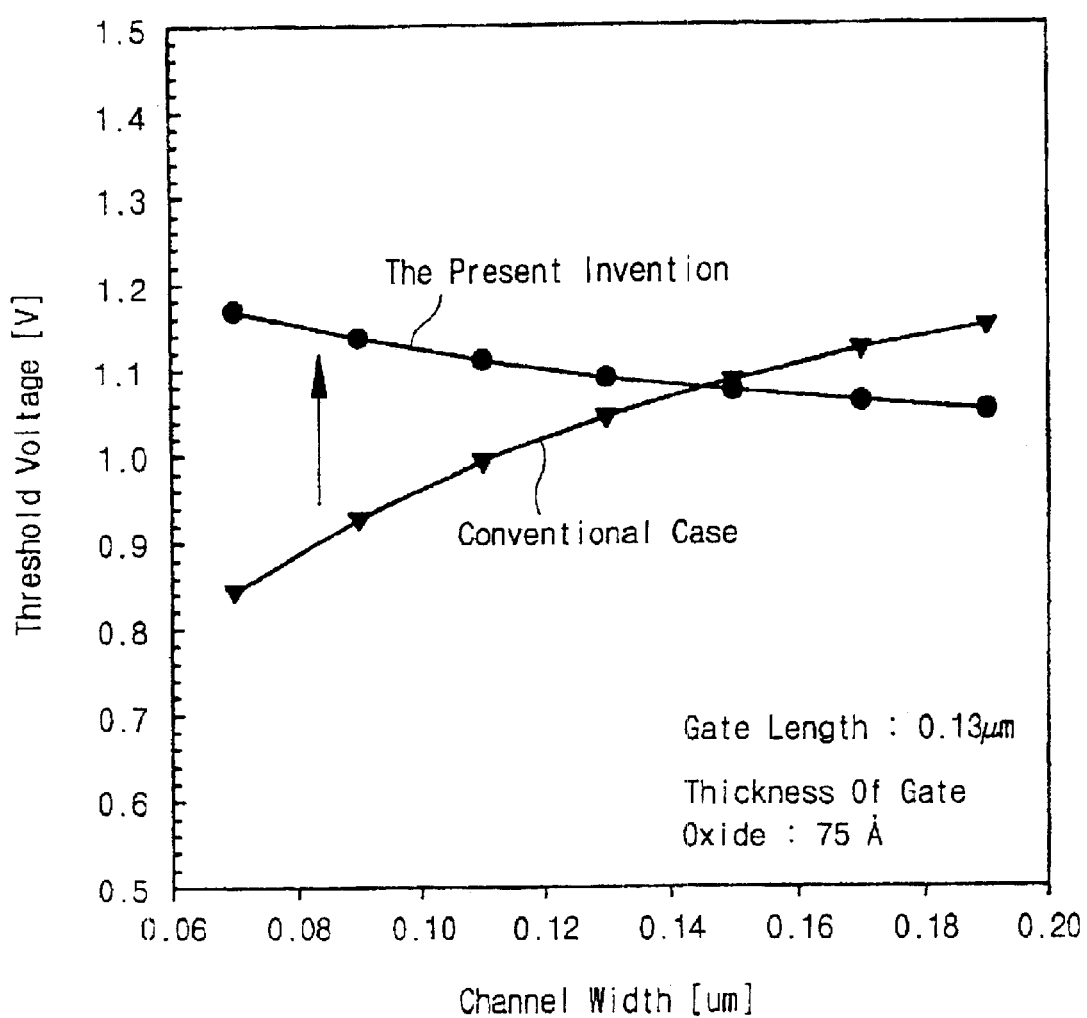
FIG. 9 is graph illustrating change of a threshold voltage based upon change of a channel width at a transistor of an integrated circuit device according to embodiments of the present invention.

Now referring to FIG. 8, a chart that illustrates the difference between drain currents which flow at a given voltage applied to the gate electrode in the prior art (represented by triangular dots) and embodiments of the present invention (represented by black dots) will be described. As illustrated, according to embodiments of the present invention a drain current does not flow when the gate voltage is low. Furthermore, as illustrated in FIG. 9, according to embodiments of the present invention, the narrower the channel width, the higher the threshold voltage. In contrast, in a conventional integrated circuit, the narrower the channel width, the lower the threshold voltage. The results exhibited by embodiments of the present invention are similar to the results of the LOCOS technique discussed above, i.e. the narrow width effect. The narrow width effect may be a tolerable matter in high-integration semiconductor devices because adjusting the polysilicon doping concentration in order to reduce the number of problems that affect the reliability of the integrated circuit easily controls it.

Figure 10:
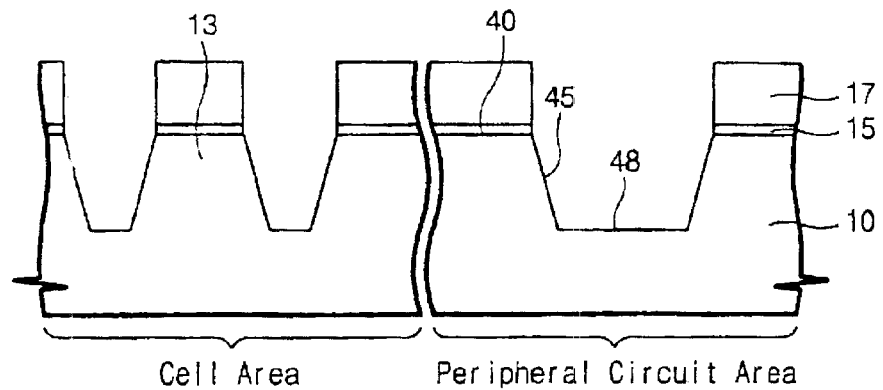
FIGS. 10 through 15 are cross-sectional views of the present invention illustrating the fabrication of an integrated circuit according to embodiments of the present invention.

FIGS. 10 through 15 illustrate the fabrication of integrated circuits according to embodiments of the present invention. As seen in FIG. 10, a trench is formed in the face 40 of a silicon substrate 10. A pad oxide layer 15 is formed on the substrate 10 and a silicon nitride layer 17 is formed on the pad oxide layer 15. The silicon nitride layer 17 is relatively thicker than the pad oxide layer 15. For example, the pad oxide layer 15 may have a thickness of about 10 Å to about 500 Å and the silicon nitride layer 17 may have a thickness of about 1,500 Å. An optional mask, i.e. a silicon oxide layer, and an anti-reflective layer for a photolithographic process may be formed on the silicon nitride layer 17.

The trench may be formed in the face 40 of the substrate 10. For example, the silicon nitride layer 17 and the pad oxide layer 15 may be patterned to form a mask using conventional photolithographic and etching processes known to those having skill in the art. The mask may be formed to expose a trench area in which a shallow trench isolation layer is formed. Using the mask, the substrate 10 may be etched through the mask a distance of thousands of angstroms, for example, 2500 Å, to form a trench. The trench in the face 40 of the substrate 10 has a trench sidewall 45 and a trench floor 48.

Figure 11:
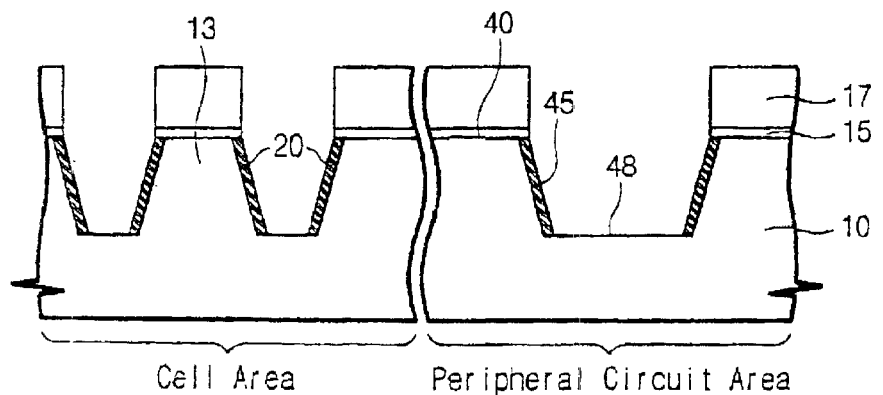

Now referring to FIG. 11, the trench sidewall 45 is annealed. This annealing process may cure the crystalline defects caused during the etching process. A first insulating layer 20 is formed on the trench sidewall 45. Conventionally, the first insulating layer includes a thermal oxide layer formed by annealing and a silicon nitride layer formed on the thermal oxide layer. Alternatively, the first insulating layer may be formed of a single SiON layer to simplify the fabrication process. If a single SiON layer is utilized, the trench formed in the face 40 of the substrate 10 may be annealed at a temperature of about 850° C. in nitrogen ambient, forming an SiON layer on the exposed surface of the substrate 10 having a thickness of about 10 Å to about 100 Å. The first insulating layer 20 may be removed from at least part of the trench floor 48, but the first insulating layer may remain on the trench sidewall 45. The first insulating layer may be removed using an anisotropic etch.

Figure 12:
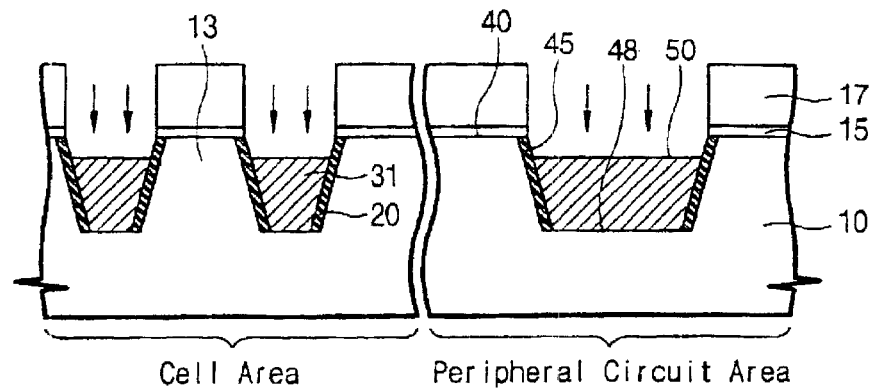

Now referring to FIG. 12, a conductive plug 31 is formed in the trench on the trench floor 48. The conductive plug 31 has a plug top 50 opposite the trench floor 48. The conductive plug is electrically connected to the substrate 10 at the trench floor 48 through the portion of the trench floor 48 where the first insulating layer 20 has been removed. The plug top 50 is recessed beneath the face 40 of the substrate 10. The conductive material may be formed on the entire surface of the device in FIG. 11 to a thickness of about 3,000 Å and then etched so that the conductive plug is recessed beneath the surface of the substrate 10. In order to recess the conductive plug 31, a full isotropic etch may be used using an etchant that has an etching selectivity with respect to the conductive plug 31. If, for example, the conductive plug 31 is made of polysilicon, it may be doped with impurities by using an ambient containing an impurity gas. Alternatively, the entire surface of the substrate 10 may be doped with impurities after forming the conductive plug 31. Thus, for example, boron ions may be implanted with 30 keV and dose of $1 \times 10^{15}$ ions/cm$^2$.

The impurity concentration of the surface layer of the active region may be changed little because it is covered by the etching mask. However, a concentration of, for example, p-type impurities may be increased around the trench floor due to the fact that the conductive plug 31 is electrically connected to the substrate 10 without an insulating layer therebetween. This aspect of the present invention can lead to a tight device isolation between the n-type transistors due to the p-n junction made at the boundary between the source/drain region and impurity enhanced substrate around the trench floor. Such an effect may be regarded as similar to the conventional narrow width effect discussed above with respect to the LOCOS technique.

Figure 13:
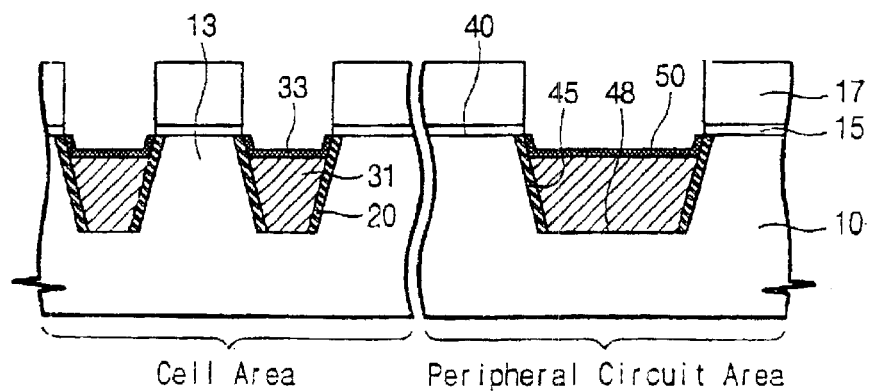

Now referring to FIG. 13, a second insulating layer may be formed on the surface of the structure in FIG. 12. The second insulating layer may include a silicon nitride layer 33. The silicon nitride layer 33 is formed on the top of the conductive plug and may have a thickness of about 10 Å to about 500 Å. The second insulating layer is formed on the top of the conductive plug and may extend onto the trench sidewall 45. If the conductive plug 31 is formed of a polysilicon layer, the polysilicon layer may be heated and nitrified in a nitrogen-contained gas. The second insulating layer, for example, a silicon nitride layer 33, may be formed on the top of the conductive plug 31, and may serve as an oxygen barrier for preventing re-oxidation of the conductive plug 31 in a high temperature process of oxygen ambient.

Figure 14:
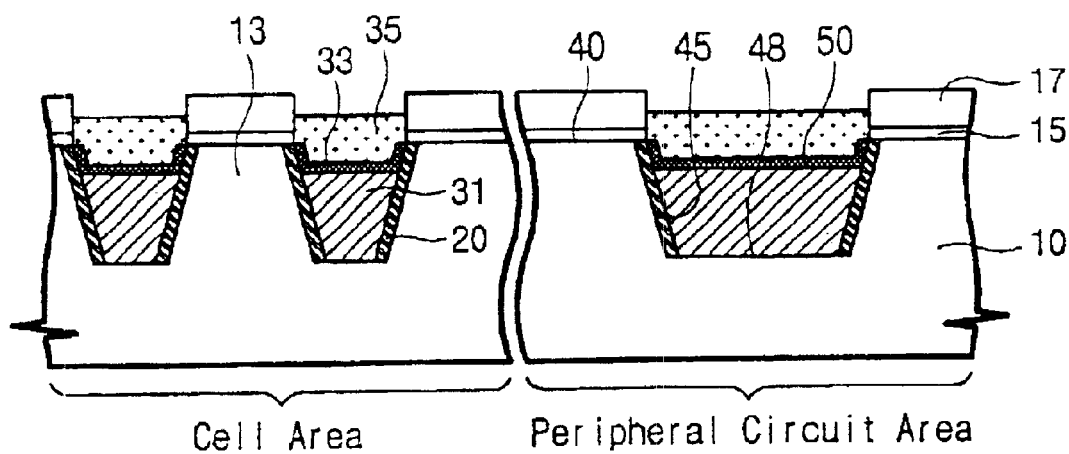
Figure 15:
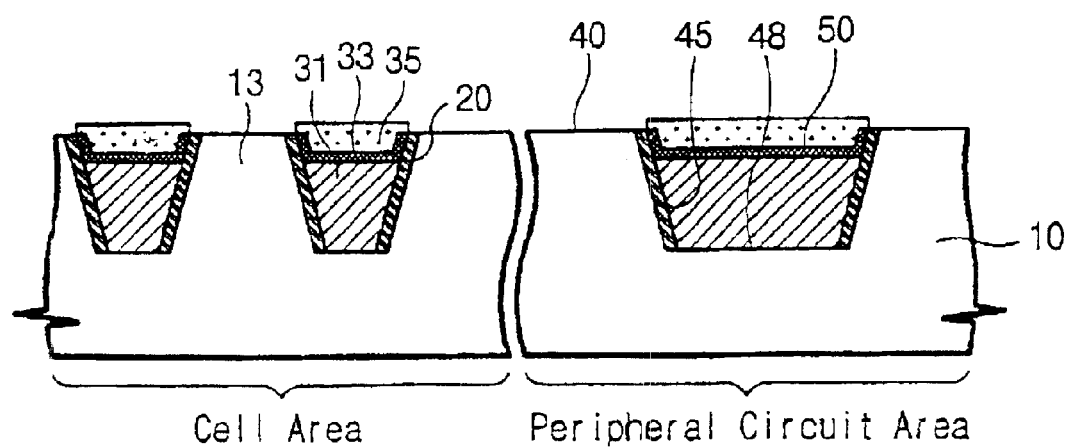

Now referring to FIG. 14, a chemical vapor deposition (CVD) silicon oxide layer 35 may be formed on the structure of FIG. 13, and planarized by way of a chemical mechanical polishing (CMP). As a result, a second insulating layer of a shallow trench isolation layer is completed. Thus, the second insulating layer may include both a silicon nitride layer 33 and a silicon oxide layer 35. Now referring to FIG. 15, identical to FIG. 5, the mask layers such as silicon nitride layer 17 and silicon oxide layer 15 may be removed. Since mask layers include silicon nitride, the mask layers may be removed by means of a phosphate-contained etchant.

As discussed above, embodiments of the present invention can provide integrated circuit devices having a trench isolation structure that includes a conductive plug in the trench isolation structure that is electrically connected to the substrate through a trench floor that is at least partially devoid of an insulating layer. Thus, if a substrate is lightly doped with p-type impurities, the conductive plug and the substrate may form an ohmic contact. Therefore, a voltage applied to the substrate may be directly applied to the conductive plug in the trench making it is possible to achieve tight device isolation between the active regions having a source/drain region that is doped with n-type impurities. Accordingly, embodiments of the present invention may reduce the occurrence of the inverse narrow width effect.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an integrated circuit device, comprising:

forming a trench in a face of an integrated circuit substrate, the trench having a trench sidewall and a trench floor;

forming a first insulating layer of a single layer of silicon oxy-nitride (SiON) on the trench sidewall that exposes at least part of the trench floor;

forming a conductive plug in the trench on the trench floor that is electrically connected to the substrate at the trench floor through the trench sidewall that exposes the at least part of the trench floor, the plug also having a plug top opposite the trench floor that is recessed beneath the face of the substrate; and forming a second insulating layer on the plug top.

2. The method of claim 1, wherein forming the second insulating layer comprises forming the second insulating layer on the plug top and extending the second insulating layer onto the trench sidewall between the plug top and the face.

3. The method of claim 1, wherein the second insulating layer comprises a conformal insulating layer on the plug top that is recessed beneath the face and also extends onto the trench sidewall between the plug top and the face.

4. A method of fabricating an integrated circuit device, comprising:

forming a trench in a face of an integrated circuit substrate, the trench baying a trench sidewall and a trench floor;

annealing the substrate to form a thermal oxide layer on the trench sidewall and the trench floor;

forming a silicon nitride layer on the thermal oxide layer to form a first insulating layer of the thermal oxide layer and the silicon nitride layer; and etching anisotropically the first insulating layer of the silicon nitride layer and the thermal oxide layer to expose at least pert of the trench floor;

forming a conductive plug in the trench on the trench floor and having a plug top opposite the trench floor;

etching the conductive plug so that the plug top is recessed beneath the surface of the substrate; and forming a second insulating layer on the face including the conductive plug.

5. The method of claim 4, wherein forming an integrated circuit substrate having a trench comprises:

forming a mask on the face; and etching the trench through the mask.

6. The method of claim 4, wherein the following is performed before forming a trench:

depositing a pad oxide layer on the substrate; and depositing a silicon nitride layer on the substrate.

7. A method of fabricating an integrated circuit device, comprising:

forming a trench in a face of an integrated circuit substrate, the trench having a trench sidewall and a trench floor;

annealing the substrate at a temperature of about 850° C. in a nitrogen ambient;

forming a first insulating layer of a signal layer of an SiON layer on the exposed surface of the substrate;

etching the SiON layer so that SiON layer is removed from at least part of the trench floor;

forming a conductive plug in the trench on the trench floor and having a plug top opposite the trench floor;

etching the conductive plug so that the plug tip is recessed beneath the surface of the substrate; and forming a second insulating layer on the face including the conductive plug.

8. The method of claim 7, wherein forming an integrated circuit substrate having a trench comprises:

forming a mask on the face; and etching the trench through the mask.

9. The method of claim 7, wherein the following is performed before forming a trench:

depositing a pad oxide layer on the substrate; and depositing a silicon nitride layer on the substrate.

* * * * *

UNITED STATES PATENT AND TRADEMARK OFFICE
CERTIFICATE OF CORRECTION

PATENT NO. : 6,955,972 B2
DATED : October 18, 2005
INVENTOR(S) : Lee et al.

It is certified that error appears in the above-identified patent and that said Letters Patent is hereby corrected as shown below:

<u>Column 8,</u>
Line 17, should read -- substrate, the trench having a trench sidewall and a --.
Line 26, should read -- expose at least part of the trench floor; --.

Signed and Sealed this

Twenty-eighth Day of March, 2006

JON W. DUDAS
*Director of the United States Patent and Trademark Office*